United States Patent
Teboulle

(10) Patent No.: US 11,150,282 B2
(45) Date of Patent: Oct. 19, 2021

(54) METER ARRANGED TO OPEN A SWITCHING MEMBER WHEN THE UPSTREAM VOLTAGE FALLS BELOW A THRESHOLD VOLTAGE

(71) Applicant: SAGEMCOM ENERGY & TELECOM SAS, Rueil Malmaison (FR)

(72) Inventor: Henri Teboulle, Rueil Malmaison (FR)

(73) Assignee: SAGEMCOM ENERGY & TELECOM SAS, Rueil Malmaison (FR)

( * ) Notice: Subject to any disclaimer, the term of this patent is extended or adjusted under 35 U.S.C. 154(b) by 26 days.

(21) Appl. No.: 16/617,113

(22) PCT Filed: May 25, 2018

(86) PCT No.: PCT/EP2018/063789
§ 371 (c)(1),
(2) Date: Nov. 26, 2019

(87) PCT Pub. No.: WO2018/219811
PCT Pub. Date: Dec. 6, 2018

(65) Prior Publication Data
US 2020/0256901 A1 Aug. 13, 2020

(30) Foreign Application Priority Data
May 31, 2017 (FR) ...................................... 1754836

(51) Int. Cl.
*G01R 31/08* (2020.01)
*G01R 22/06* (2006.01)
(Continued)

(52) U.S. Cl.
CPC ......... *G01R 22/061* (2013.01); *G01R 31/086* (2013.01); *H01H 83/12* (2013.01);
(Continued)

(58) Field of Classification Search
CPC .... G01R 19/2513; G01R 31/50; G01R 31/52; G01R 31/086; G01R 22/061; G01R 22/10;
(Continued)

(56) References Cited

U.S. PATENT DOCUMENTS 4,996,646 A * 2/1991 Farrington ............... H02H 3/00
 700/293
5,940,009 A * 8/1999 Loy ....................... G01R 22/066
 340/870.02
(Continued)

FOREIGN PATENT DOCUMENTS

EP  1962098 A1  8/2008
GB  2313201 A   11/1997
(Continued)

*Primary Examiner* — Vinh P Nguyen
(74) *Attorney, Agent, or Firm* — Muncy, Geissler, Olds & Lowe, P.C.

(57) ABSTRACT

A single-phase electric meter having a phase conductor intended to be connected to a phase of an electric line located upstream of the single-phase electric meter and to a phase of an electric installation located downstream of the single-phase electric meter, the single-phase electric meter further including a breaking unit mounted on the phase conductor, an upstream voltage sensor arranged to periodically measure an upstream voltage upstream of the breaking unit, and a processing device arranged to acquire upstream voltage measurements and to open the breaking unit when the upstream voltage drops below a first predetermined threshold voltage.

16 Claims, 2 Drawing Sheets

(51) Int. Cl.
*H01H 83/12* (2006.01)
*H02H 3/06* (2006.01)
*H02H 3/07* (2006.01)
*H02H 5/10* (2006.01)

(52) U.S. Cl.
CPC ............ *H02H 3/066* (2013.01); *H02H 3/07* (2013.01); *H02H 5/10* (2013.01)

(58) Field of Classification Search
CPC ............ G01R 19/0084; G01R 19/2506; G01R 22/068; G01R 15/14; G01R 15/142; G01R 19/003; G01R 19/155; G01R 21/06; G01R 21/1331; G01R 25/00; G01R 29/00; G01R 31/08; G01R 31/54; H02H 3/00; H02H 3/042; H02H 1/04; H02H 3/04; H02H 3/044; H02H 3/07; H02H 3/08; H02H 3/20; H02H 3/207; H02H 3/38; H02H 3/066; H02H 5/10; G06F 1/266; G06F 1/28; G06F 17/18; G06F 1/3206; H02B 1/32; H04B 3/54; H04B 3/546; H04B 3/548; H04Q 2209/60; H04Q 9/00; H04Q 9/02; H01H 83/12

See application file for complete search history.

(56) References Cited

U.S. PATENT DOCUMENTS

| | | | | |
|---|---|---|---|---|
| 7,772,829 | B2 * | 8/2010 | Shuey | G01R 21/133 |
| | | | | 324/142 |
| 8,810,983 | B2 * | 8/2014 | Wilson | H02H 3/00 |
| | | | | 361/59 |
| 9,829,899 | B2 * | 11/2017 | Handley | G05F 1/00 |
| 10,868,417 | B2 * | 12/2020 | Oldham, Jr. | H02H 5/105 |
| 2014/0002940 | A1 | 1/2014 | Czarnecki | |

FOREIGN PATENT DOCUMENTS

| | | | |
|---|---|---|---|
| RU | 2498322 C1 | 11/2013 | |
| WO | WO2007121053 A2 | 10/2007 | |
| WO | WO-2014053302 A1 * | 4/2014 | .......... H02H 11/005 |
| WO | WO2014053302 A1 | 4/2014 | |
| WO | WO2015179908 A1 | 12/2015 | |

\* cited by examiner

METER ARRANGED TO OPEN A SWITCHING MEMBER WHEN THE UPSTREAM VOLTAGE FALLS BELOW A THRESHOLD VOLTAGE

The invention relates to the field of single-phase electricity meters.

BACKGROUND OF THE INVENTION

With reference to FIG. 1, it is common for a first electrical setup 1 of a first dwelling 2 and a second electrical setup 3 of a second dwelling 4 to be connected, respectively, to a first phase 5 and to a second phase 6 of one and the same three-phase electrical line 7. The first electrical setup 1 and the second electrical setup 3 are both connected to the neutral 8 of the three-phase electrical line 7. The three-phase electrical line 7 transmits, to the first electrical setup 1 and to the second electrical setup 3, the electricity that is consumed by their electrical equipment.

In the event of the neutral 8 of the three-phase electrical line 7 being broken, if the load on the first electrical setup 1 is substantially lower than the load on the second electrical setup 3 (or vice versa), the load imbalance may result in a substantial voltage drop at the input of the first electrical setup 1 and a substantial voltage rise at the input of the second electrical setup 3 (or vice versa). Current flows from the three-phase electrical line 7 via the first electrical setup 1 and the second electrical setup 3 over the loop 9.

Such a situation occurs for example when a radiator in the second electrical setup 3 is switched on and the occupants of the first dwelling 2 are out.

If the distribution network incorporating the three-phase electrical line 7 is a 230 V RMS network, the voltage at the input of the first electrical setup 1 may thus drop down to 50 V and the voltage at the input of the second electrical setup 3 may reach 398 V, which corresponds to a normal voltage between the first phase 5 and second phase 6.

Some electricity meters are provided with a switching member that makes it possible to prevent such a substantial voltage rise damaging the equipment in an electrical setup. However, not all electricity meters are provided with such a switching member. If the (single-phase) electricity meter of the second electrical setup 3 is not provided with a switching member, the electrical equipment in the second electrical setup 3 are at risk of being destroyed or even of catching fire. Specifically, if the sum of the loads on the loop 9 is high enough, the current in the second electrical setup 3 will be too small for the fuses inside the items of electrical equipment to protect them.

OBJECT OF THE INVENTION

The object of the invention is to protect an electrical setup from a substantial voltage rise due to the neutral of a three-phase electrical line being broken and due to a load imbalance, the electricity meter of said electrical setup not being provided with a switching member.

SUMMARY OF THE INVENTION

With a view to achieving this object, what is proposed is a single-phase electricity meter including a phase conductor that is intended to be connected to one phase of an electrical line that is located upstream of the single-phase electricity meter and to one phase of an electrical installation that is located downstream of the single-phase electricity meter, the single-phase electricity meter further comprising a switching member that is fitted to the phase conductor, an upstream voltage sensor that is arranged to periodically measure an upstream voltage upstream of the switching member, and processing means that are arranged to acquire upstream voltage measurements and to open the switching member when the upstream voltage falls below a first predetermined threshold voltage.

Thus, in the event of a neutral of the electrical line being broken and in the event of a load imbalance, creating a substantial voltage drop at the input of the electrical setup, the single-phase electricity meter according to the invention opens the switching member. Another electrical setup, connected to the neutral and to another phase of the same electrical line and comprising a single-phase electricity meter that is not provided with a switching member, is thus protected from a substantial voltage rise by virtue of the single-phase electricity meter according to the invention.

Also proposed is a system comprising a first single-phase electricity meter such as that described above and a second single-phase electricity meter, the second single-phase electricity meter not comprising a switching member.

Also proposed is a monitoring method implemented in a single-phase electricity meter such as that described above, including the steps of:

measuring the upstream voltage;

opening the switching member when the upstream voltage falls below a first predetermined threshold voltage.

Also proposed is a method for protecting a second electrical setup by means of a first single-phase electricity meter of a first electrical setup, the first single-phase electricity meter being in accordance with that described above, the second electrical setup including a second single-phase electricity meter comprising no switching member, the first electrical setup and the second electrical setup being connected, respectively, to a first phase and to a second phase of one and the same electrical line, the first electrical setup and the second electrical setup being connected to a neutral of the electrical line, the protection method being implemented in the first single-phase electricity meter and comprising the steps of the monitoring method described above.

Also proposed is a computer program comprising instructions for implementing by a single-phase electricity meter such as that described above, the monitoring method or the protection method that are mentioned above.

Also proposed are storage means that store a computer program comprising instructions for implementing by a single-phase electricity meter such as that described above, the monitoring method or the protection method that are mentioned above.

Other features and advantages of the invention will become apparent on reading the following description of one particular nonlimiting embodiment of the invention.

BRIEF DESCRIPTION OF THE DRAWINGS

Reference will be made to the appended drawings, in which.

DETAILED DESCRIPTION OF THE INVENTION

Figure 1:
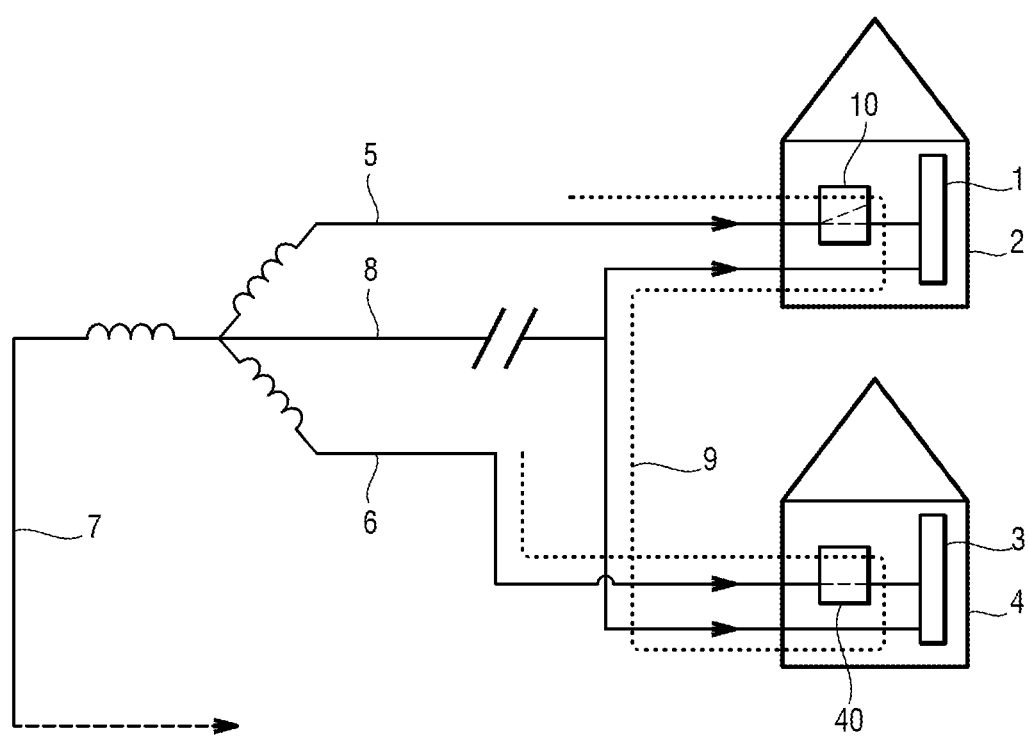
FIG. 1 shows a three-phase electrical line, a first electrical setup of a first dwelling and a second electrical setup of a second dwelling.

The invention is described in the context of FIG. 1, presented above.

The first electrical setup 1 of the first dwelling 2 and the second electrical setup 3 of the second dwelling 4 are connected, respectively, to the first phase 5 and to the second phase 6 of one and the same three-phase electrical line 7. The first electrical setup 1 and the second electrical setup 3 are both connected to the neutral 8 of the three-phase electrical line 7.

Figure 2:
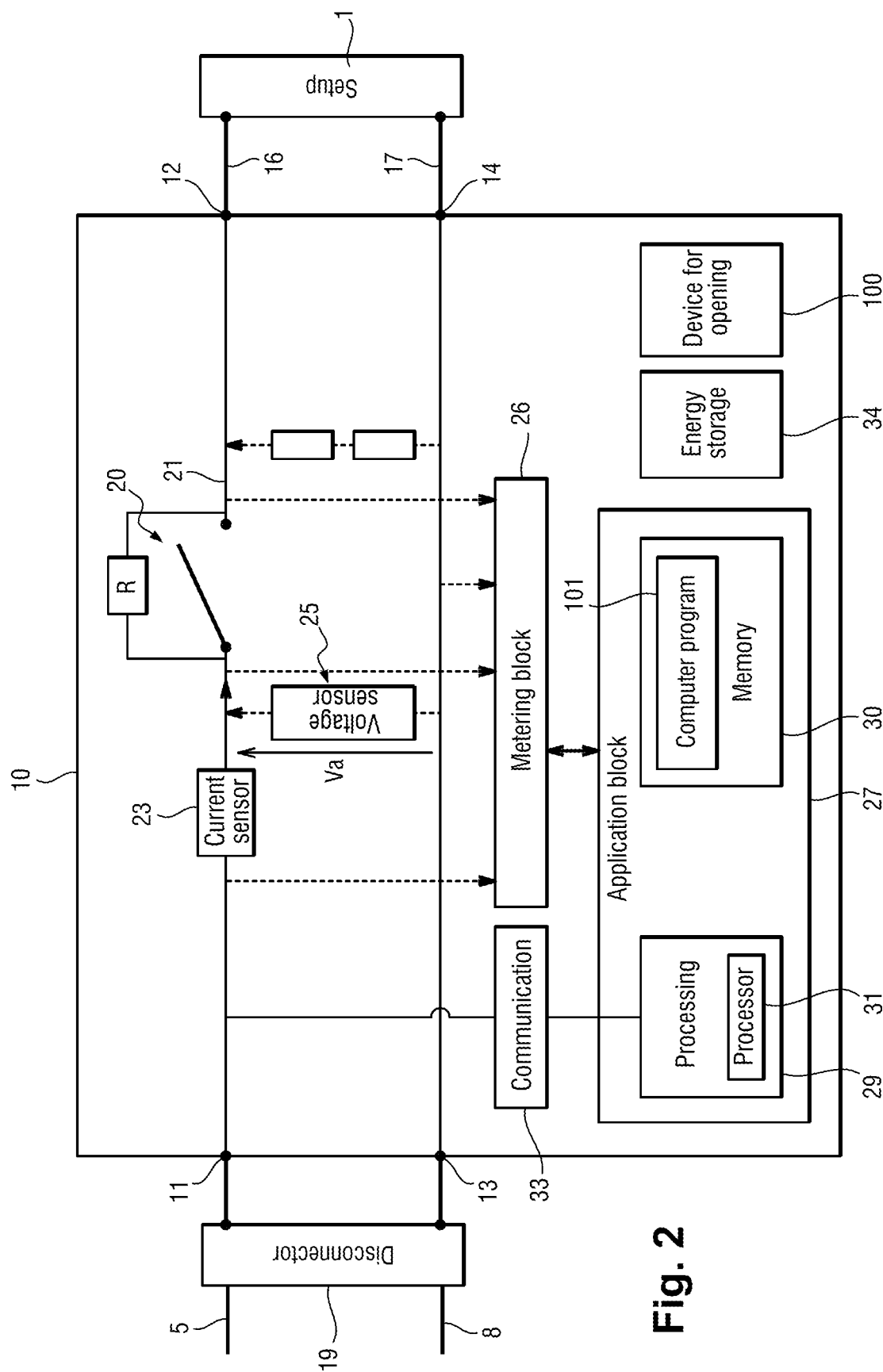
FIG. 2 shows a single-phase electricity meter according to the invention.

With reference to FIG. 2, the first electrical setup 1 include a first single-phase electricity meter 10.

The first meter 10 is intended to measure consumption of electricity delivered to the first electrical setup 1 via the three-phase electrical line 7.

The first meter 10 includes an upstream phase terminal 11, a downstream phase terminal 12, an upstream neutral terminal 13 and a downstream neutral terminal 14.

The upstream phase terminal 11 is connected to the first phase 5 of the three-phase electrical line 7. The downstream phase terminal 12 is connected to a phase 16 of the first electrical setup 1. The upstream neutral terminal 13 is connected to the neutral 8 of the three-phase electrical line 7. The downstream neutral terminal 14 is connected to a neutral 17 of the first electrical setup 1.

A disconnector 19 is positioned on the three-phase electrical line 7 side so as to be able to isolate the first electrical setup 1 from the three-phase electrical line 7.

The first meter 10 further includes a switching member 20 that is fitted to a phase conductor 21 of the first meter 10. The phase conductor 21 is connected to the first phase 5 of the three-phase electrical line 7 and to the phase 16 of the first electrical setup 1 when the first meter 10 is connected to the three-phase electrical line 7 and to the first electrical setup 1. The switching member 20 is fitted between the upstream phase terminal 11 and the downstream phase terminal 12.

The switching member 20 allows the first electrical setup 1 to be remotely connected to and disconnected from the three-phase electrical line 7.

The first meter 10 further includes an upstream voltage sensor 25 that is suitable for measuring an upstream voltage Va upstream of the switching member 20, i.e. on the three-phase electrical line 7 side in relation to the switching member 20. The upstream voltage sensor 25 is represented by two resistors, but it is possibly more complex in reality.

The first meter 10 also includes a current sensor 23 that is located on the phase conductor 21 upstream of the switching member 20, and is intended to measure a current flowing through the phase conductor 21. The current sensor 23 is here a shunt.

The meter 10 further includes a plurality of electrical components that are grouped together into a functional metering block 26 and a functional application block 27. The functional metering block 26 and the functional application block 27 are separate and independent, such that failure of one of the blocks does not lead to failure of the other block.

The functional metering block 26 acquires the upstream voltage Va measurements and transmits them to the functional application block 27.

The functional application block 27 includes processing means 29 and a memory 30.

The processing means 29 include a processing component 31 (for example a processor, a microcontroller or an FPGA). The processing component 31 is capable of executing program instructions for implementing a method for monitoring and a method for protecting the second electrical installation 3 by means of the first meter 10. The processing component 31 is in particular capable of managing the operation of the first meter 10, of opening and of closing the switching member 20 via an opening device, and of acquiring and of processing the upstream voltage Va measurements. The opening device is incorporated within the first meter 10.

The memory 30 is a nonvolatile memory able to store data to which the processing component 31 has access and a computer program 101 that comprises instructions for implementing by a single-phase electricity meter, the monitoring method and the protection method described in the present specification.

The first meter 10 further includes a powerline communication module 33 that is arranged to transmit messages over the three-phase electrical line 7. The communication module 33 is supplied with power directly by the three-phase electrical line 7.

The first meter 10 finally includes an energy storage component 34 that is suitable for supplying the communication module 33 with power for a certain duration while the switching member 20 is open. Specifically, in the case that the switching member 20 is open, the communication module 33 can no longer be supplied with power by the three-phase electrical line 7.

Regarding the second electrical setup 3, it comprises a second single-phase electricity meter 40 that includes no switching member.

Thus, in the event of the neutral 8 of the three-phase electrical line 7 being broken, if the load on the first electrical setup 1 is substantially lower than the load on the second electrical setup 3, the second electrical setup 3 is not effectively protected from a substantial voltage rise at the input of the second electrical setup 3. It is the first meter 10 that protects the second electrical setup 3 in such a situation.

To do this, when the processing component 31 of the first meter 10 detects that the upstream voltage Va in the first meter 10 has fallen below a first predetermined threshold voltage, the processing component 31 opens the switching member 20 of the first meter 10. Thus, the load imbalance does not affect the voltage at the input of the second electrical setup 3 any longer. The second electrical setup 3 therefore no longer experiences the substantial voltage rise.

The first predetermined threshold voltage is here equal to 160 V.

The upstream voltage sensor 25 periodically measures the upstream voltage Va, here every 100 ms. This short time between measurements, and hence the high frequency of the upstream voltage Va measurements, makes it possible to ensure that the switching member 20 is opened rapidly in the event of the neutral 8 breaking.

The switching member 20 is opened only if the substantial voltage drop at the input of the first electrical 1 happened rapidly.

In this way it is ensured that the situation that caused the substantial voltage drop at the input of the first electrical setup 1 and the substantial voltage rise at the input of the second electrical setup 3 indeed corresponded to the neutral 8 of the three-phase electrical line 7 breaking.

The processing component 31 therefore opens the switching member 20 only when the upstream voltage Va transitions from a normal value to a value that is lower than the first predetermined threshold voltage in a time that is shorter than a predetermined duration. The normal value is here an RMS voltage of 230 V.

The predetermined duration is equal to a few seconds, and is here between one second and 10 seconds.

When the processing component 31 detects that the upstream voltage Va has risen above a second predetermined threshold voltage, the processing component 31 closes the switching member 20. This situation corresponds to the neutral 8 of the three-phase electrical line 7 being repaired and the upstream voltage Va (and hence the voltage at the input of the first electrical setup 1) returning to the normal value.

The second predetermined threshold voltage is here equal to 180 V.

The processing component 31 closes the switching member 20 after a random duration starting from when the processing component 31 detects that the upstream voltage Va has risen above the second predetermined threshold voltage. The random duration is here between 10 seconds and two minutes. This random time delay makes it possible to prevent several dwellings fitted with meters that are similar to the first meter 10 from restarting simultaneously, and hence an electrical setup of one of these dwellings from experiencing a substantial voltage rise in turn.

The random duration is increased automatically (while remaining random) after the processing component 31 has closed the switching member 20 twice because of an upstream voltage Va that is lower than the first predetermined threshold voltage, i.e. after the switching member 20 has been reset twice subsequent to the detection of the neutral 8 breaking.

Once the switching member 20 has closed twice, the random duration is then increased after every new closure due to an upstream voltage Va lower than the first predetermined threshold voltage.

In this way the first electrical setup 1 is prevented from restarting while there is still a fault on the neutral 8 of the three-phase electrical line 7. The first electrical setup 1 being deactivated for a long time indicates that the neutral 8 must now necessarily be repaired.

When the processing component 31 detects a voltage drop at the input of the first electrical installation 1, the processing component 31 controls the communication module 33 so that it generates a warning message for the information system (SI). The warning message warns the SI that the neutral 8 of the three-phase electrical line 7 has broken.

The warning message is transmitted by powerline communication between the phase 5 and the neutral 8 of the three-phase electrical line 7. The DLMS or COSEM application layers are advantageously used.

The storage component 34 is sized for supplying power to the device for opening the switching member 20 and the communication module 33 for a duration of transmission of the warning message in the event of a voltage drop no longer allowing the first meter 10 to be supplied with power. The storage component 34 comprises for example electrolytic capacitors of around 100 µF that are connected to a supply voltage of the first meter 10.

Of course, the invention is not limited to the described embodiment but encompasses all variants that come within the scope of the invention as defined by the claims.

Although a particular architecture of the single-phase electricity meter has been described, it could of course be different. The electrical components used could themselves also be different.

It should be noted that, although only a first electrical setup and a second electrical setup have been mentioned, it is possible and even likely that a plurality of electrical setups will be connected to the first phase of the three-phase electrical line and that a plurality of electrical setups will be connected to the second phase of the three-phase electrical line.

Furthermore, the invention is applicable to any type of electrical line comprising a neutral and at least two phases.

The invention claimed is:

1. A single-phase electricity meter including a phase conductor that is intended to be connected to one phase of an electrical line that is located upstream of the single-phase electricity meter and to one phase of an electrical setup that is located downstream of the single-phase electricity meter, the single-phase electricity meter further comprising a switching member that is fitted to the phase conductor, an upstream voltage sensor that is arranged to periodically measure an upstream voltage upstream of the switching member, and processing means that are arranged to acquire upstream voltage measurements and to open the switching member when the upstream voltage falls below a first predetermined threshold voltage.

2. The single-phase electricity meter according to claim 1, wherein the processing means are arranged to open the switching member when the upstream voltage transitions from a normal value to a value that is lower than the first predetermined threshold voltage in a time that is shorter than a predetermined duration.

3. The single-phase electricity meter according to claim 1, wherein the processing means are arranged to close the switching member when the upstream voltage rises above a second predetermined threshold voltage.

4. The single-phase electricity meter according to claim 3, wherein the processing means are arranged to close the switching member after a random duration starting from when the processing means detect that the upstream voltage has risen above the second predetermined threshold voltage.

5. The single-phase electricity meter according to claim 4, the processing means being arranged to increase the random duration after the processing means have closed the switching member twice because of an upstream voltage that is lower than the first predetermined threshold voltage.

6. The single-phase electricity meter according to claim 5, wherein the processing means are arranged, after two closures of the switching member, to increase the random duration after each new closure due to an upstream voltage lower than the first predetermined threshold voltage.

7. The single-phase electricity meter according to claim 1, further comprising a powerline communication module connected to the line and to the processing means, the powerline communication module being arranged to transmit a warning message over the electrical line when the upstream voltage falls below the first predetermined threshold voltage.

8. The single-phase electricity meter according to claim 7, further comprising a device for opening the switching member and an energy storage component that is suitable for supplying power to the device for opening the switching member and the communication module for a duration of transmission of the warning message in the event of a voltage drop no longer allowing the single-phase electricity meter to be supplied with power.

9. A system comprising a first single-phase electricity meter according to claim 1 and a second single-phase electricity meter, the first single-phase electricity meter and the second single-phase electricity meter being each connected to a distinct phase of the same three-phase electrical line, the second single-phase electricity meter not comprising a switching member.

10. A monitoring method implemented in a single-phase electricity meter according to claim 1, including the steps of:

measuring the upstream voltage;
opening the switching member when the upstream voltage falls below a first predetermined threshold voltage.

11. The monitoring method according to claim 10, further including the step of closing the switching member when the upstream voltage rises above a second predetermined threshold voltage.

12. A method for protecting a second electrical setup by the single-phase electricity meter of a first electrical setup, the second electrical setup including a second single-phase electricity meter comprising no switching member, the first electrical setup and the second electrical setup being connected, respectively, to a first phase and to a second phase of one and the same electrical line, the first electrical setup and the second electrical setup being connected to a neutral of the electrical line, the protection method being implemented in the single-phase electricity meter and comprising the steps of the monitoring method according to claim 10.

13. A computer program comprising instructions for implementing the method for protecting a second electrical setup by the single-phase electricity meter of a first electrical setup according to claim 12.

14. A storage means which stores a computer program comprising instructions for implementing the method for protecting a second electrical setup by the single-phase electricity meter of a first electrical setup according to claim 12.

15. A computer program comprising instructions for implementing the monitoring method according to claim 10.

16. A storage means which stores a computer program comprising instructions for implementing the monitoring method claim 10.

* * * * *